United States Patent [19]

Nishimura et al.

[11] 4,281,295
[45] Jul. 28, 1981

[54] NOISE REDUCING APPARATUS

[75] Inventors: Satoshi Nishimura, Kagamigahara; Tetsuo Shimizu, Gifu; Kenichi Sato, Gifu; Takehiko Asano, Gifu, all of Japan

[73] Assignee: Sanyo Electric Co., Ltd., Osaka, Japan

[21] Appl. No.: 938,009

[22] Filed: Aug. 30, 1978

[30] Foreign Application Priority Data

Sep. 2, 1977 [JP] Japan ................... 52-106441

[51] Int. Cl.³ ........................... H04B 1/64
[52] U.S. Cl. ......................... 333/14; 330/85; 330/126; 330/132
[58] Field of Search ............ 333/14; 330/51, 85, 330/132, 136; 455/72

[56] References Cited

U.S. PATENT DOCUMENTS

| 3,729,693 | 4/1973 | Dolby | 333/14 |
| 3,815,039 | 6/1974 | Fujisawa et al. | 333/14 X |
| 3,902,131 | 8/1975 | Dorren | 333/14 X |
| 3,969,680 | 7/1976 | Wermuth | 333/14X |
| 4,114,115 | 9/1978 | Minnis | 333/14 |
| 4,162,462 | 7/1979 | Endoh et al. | 333/14 |

Primary Examiner—Paul L. Gensler
Attorney, Agent, or Firm—Darby & Darby

[57] ABSTRACT

A frequency region split type noise reducing apparatus, comprising a compressor and an expander; the compressor (or the expander) including a plurality of frequency region splitting filters for splitting the frequency range of the signal into a plurality of frequency regions, a plurality of level sensors for detecting the levels of the signals in the respective frequency regions split by the plurality of filters, a plurality of voltage controlled amlifiers responsive to the level detected outputs of the corresponding level sensors for linearly compressing (or expanding) in terms of a logarithmic scale the dynamic range of the signal, and an adder for adding the outputs as compressed by the voltage controlled amplifiers for providing a composite signal, and the expander (or the compressor) including an amplifier and a switch circuit for connecting the compressor (or expander) to the amplifier to form a negative feedback circuit, whereby the expander (or the compressor) is implemented by a negative feedback amplifier including the amplifier and the negative feedback circuit.

15 Claims, 16 Drawing Figures (A) PRIOR ART (B)

NOISE REDUCING APPARATUS

BACKGROUND OF THE INVENTION

1. Field of the Invention

The present invention relates to a noise reducing apparatus of a compression/expansion type for preventing deterioration of the signal to noise ratio caused by a noise in a signal transmission system. More specifically, the present invention relates to an improvement in a frequency region split type noise reducing apparatus employing compression/expansion for effectively suppressing a noise breathing phenomenon occurring in a signal transmission system.

2. Description of the Prior Art

A noise reducing apparatus employing signal compression/expansion has been proposed and put into practical use in a signal transmission system such as tape recorders, disc record players and the like for the purpose of preventing deterioration of the signal to noise ratio of the signal because of a narrow dynamic range of a record medium in such signal transmission system. Typical prior art noise reduction systems comprise a Dolby system, a dbx system and the like. The Dolby system is described in detail in, for example, British Pat. No. 1,120,541 and U.S. Pat. No. 3,631,365. On the other hand, the dbx system is described in detail in, for example, U.S. Pat. Nos. 3,681,618; 3,714,462; and 3,789,143.

FIG. 1 shows a block diagram of such a compression-/expansion type noise reducing apparatus applied to a tape recorder. In the art, the term "compression/expansion" is referred to as "compansion" and the term "compansion" is often used herein to mean "compression/expansion". The noise reducing apparatus shown in FIG. 1 basically comprises an input terminal 1 adapted to receive an input signal Si, a compressor A including a voltage controlled amplifier 3 connected to receive the input signal and a level sensor 5 for detecting the level of the signal for providing a voltage control signal to the voltage controlled amplifier 3, a tape recorder 11 connected to record the output of the voltage controlled amplifier 3 on a record medium such as a magnetic tape, an expander B including another voltage controlled amplifier 4 connected to receive a reproduced signal from the tape recorder 11 and a level sensor 6 for detecting the level of the signal for providing a voltage control signal to the voltage controlled amplifier 4, and an output terminal 2 adapted to withdraw the output signal So. As well known, the voltage controlled amplifier 3 is structured to compress in a linear manner in terms of a logarithmic scale the dynamic range of the signal as a function of a voltage control signal. On the other hand, the voltage controlled amplifier 4 is structured to expand in a linear manner in terms of a logarithmic scale the dynamic range of the signal as a function of a control signal.

FIG. 2 is a graph showing a compansion characteristic in the case where the compansion coeffecient is 2, wherein the abscissa indicates the input level In and the ordinate indicates the output level Out, the line "a" showing a compression characteristic and the line "b" showing an expansion characteristic.

Thus, according to the noise reducing apparatus shown in FIG. 1, the dynamic range of the signal is compressed and expanded in a linear manner in terms of a logarithmic scale. Referring to FIG. 2, for example, an input signal having a dynamic range of 100 dB is compressed into a signal having a dynamic range of 50 dB and is recorded, while a signal having a dynamic range of 50 dB obtained from the tape recorder 11 is expanded into a signal having the original dynamic range of 100 dB and is withdrawn from the output terminal. Referring to FIG. 1, the compressing operation is achieved by the voltage controlled amplifier 3 serving as a voltage controlled variable gain circuit which is operable to have the gain thereof variable as a function of the signal level output from the level sensor 5. Similarly, the expanding operation is achieved by the voltage controlled amplifier 4 serving as a voltage controlled variable gain circuit which is operable to have the gain thereof variable as a function of the signal level output of the level sensor 6. More specifically, the voltage controlled amplifier 3 is structured to reduce the gain thereof in reverse proportion to an increase of a control signal for the purpose of compressing operation, whereas the voltage controlled amplifier 4 is structured to increase the gain thereof in proportion to the increase of the voltage control signal for the purpose of the expanding operation.

It has been observed that a noise breathing phenomenon occurs in such a compression/expansion type noise reducing apparatus. More specifically, a noise occurring in a signal transmission system is modulated because of variation of the gain of the above described voltage controlled amplifiers and accordingly a noise is heard as level varying. In case of a tape recorder, for example, a hissing noise occurs in case of reproduction of the signal. It has also been observed that a hissing noise is rather similar to a white noise in terms of the spectrum and is very offensive to the ear in the high frequency region, as readily understood from the Noise Rating Number curve. Thus, if such a noise reduction apparatus as shown in FIG. 1 is applied to a tape recorder having the above described noise characteristic, the level of the hissing noise varies over a full range of the frequencies as a function of variation of the level of the recorded audio signal, which makes the reproduced sound offensive to the ear. If and when the recorded audio signal includes frequency components of a broad spectrum to extend even to the high frequency region, then the hissing noise is masked by such frequency components of the audio signal in the high frequency region and the uncomfortableness is substantially mitigated. However, on the average, an ordinary audio signal has an energy distribution which is rather dominant in the lower and middle frequency regions and therefore the hissing noise of the high frequency region is liable to be less masked.

Referring again to FIG. 1, the noise reducing apparatus shown in FIG. 1 employs a preemphasis circuit 7 for emphasizing a high frequency region and a deemphasis circuit 8 having a complementary characteristic for the purpose of eliminating the above described shortcomings in a prior art compansion type noise reducing apparatus. More specifically, according to the FIG. 1 noise reducing apparatus, an audio signal component in the high frequency region where a hissing noise is likely to be conspicuous is in advance emphasized and then recorded, whereupon the signal is processed to return to the original state in reproduction, in order to improve the signal to noise ratio in the high frequency region. However, in order for this process to be effective, it is required that a tape recorder has a broad dynamic range sufficient to accomodate the amount of emphasis in the high frequency region. In actuality, however, the dynamic range in the high frequency region in a typical tape recorder presently available is narrower as compared with the dynamic ranges for middle and lower frequency regions and therefore it is very difficult to have a sufficient amount of range for emphasis in the higher frequency region in such a tape recorder.

Referring again to FIG. 1, the noise reducing apparatus shown in FIG. 1 further employs weighting circuits 9 and 10 coupled to the inputs of the level sensors 5 and 6 for the purpose of supplementing the preemphasis and deemphasis. To that end, the weighting circuits 9 and 10 are structured to exhibit a frequency characteristic wherein a higher frequency region is emphasized. More specifically, when a signal is received wherein energy is dominant in the higher frequency region, the voltage controlled amplifier 3 for the compressing operation is controlled by the weighting circuit 9 to lower the gain thereof, in order to avoid saturation in the higher frequency region by virtue of the emphasis. Nevertheless, another problem is encountered in that the signal to noise ratio throughout the full frequency range is lowered by the weighting operation.

Since the above described emphasis in the higher frequency region raises the energy level of the signal in the higher frequency region, the same serves to reduce relatively the influence on the lower frequency region. As a result, a noise breathing phenomenon in the higher frequency region can be reduced to some extent, although it is still insufficient. It has been observed that such a problem is more aggravated in case of a music sound including piano tones. This is accounted for by the fact that since piano tones have a frequency spectrum of a simple structure similar to a pure tone, the piano tones inherently have a much less masking effect upon a noise and in addition the energy distribution of the piano tones is more dominant in the middle and lower frequency regions, so that the piano tones are much less effective in performing a masking operation upon a varying noise in the higher frequency region. In addition, the improvement by means of emphasis, as described above, is merely aimed to reduce a noise in the higher frequency region which is inoffensive to the ear and is not effective in the reduction of a noise breathing phenomenon in the lower frequency region. It has been observed from the Noise Rating Number characteristic that if the noise level is constant then a noise in the lower frequency region is less conspicuous as compared with a noise in the higher frequency region but if and when the noise level is varying the noise is more likely to be perceived by a listener. Thus, it is in the lower frequency region desired that some expedient is provided for eliminating the above described problems.

As described previously, the reason why a noise breathing phenomenon is less effectively reduced in case of piano tones by means of the FIG. 1 noise reducing apparatus is that although the signal energy distribution is dominant in the middle and lower frequency regions the compression/expansion operation is effected over the full frequency range, which causes a noise in the higher frequency region where no sound signal exists to be heard without any masking effect thereupon.

In order to solve the above described problem, it has been proposed that a full frequency range be split into a plurality of frequency regions and each frequency region be separately subjected to compansion rather than the full frequency range being simultaneously subjected to compansion. More specifically, according to such a frequency region split type noise reducing apparatus, in a frequency region where a sound signal exists, no variation of the noise level is perceived as a result of a masking operation, whereas in a frequency region where no sound signal exists, a noise component is not modulated by a sound signal and is fully suppressed by virtue of the expanding operation, with the result that a noise component is much less perceived.

FIG. 3 shows a block diagram of a frequency region split type noise reducing apparatus employing compansion, wherein a frequency range is split into two frequency regions. The noise reducing apparatus shown in FIG. 3 basically comprises a frequency region split type compressor A connected between an input terminal 1 adapted to receive an input signal Si and a tape recorder 11 and a frequency region split type expander B connected between the tape recorder 11 and an output terminal 2 adapted to withdraw an output signal So. The compressor A comprises a lower frequency compressor including a low pass filter 16, a voltage controlled amplifier 3 connected to receive the output of the low pass filter 16, and a level sensor 5 for detecting the signal level for providing a voltage control signal to the voltage controlled amplifier 3. There is also a high frequency compressor including a high pass filter 18, a voltage controlled amplifier 12 connected to receive the output of the high pass filter 18 and a level sensor for detecting the signal level for providing a voltage control signal to the voltage controlled amplifier 12. An adder 20 is provided for adding the outputs of the voltage controlled amplifiers 3 and 12 for providing a signal being recorded Sr. Similarly, the expander B comprises a lower frequency expander including a low pass filter 17, a voltage controlled amplifier 4 connected to receive the output of the low pass filter 17 and a level sensor 6 for detecting the signal level for providing a voltage control signal to the voltage controlled amplifier 6. There is also a high frequency expander including a high pass filter 19, a voltage controlled amplifier 13 connected to receive the output of the high pass filter 19 and a level sensor 15 for detecting the signal level for providing a voltage control signal to the voltage controlled amplifier 13. An adder 21 is provided for adding the outputs of the voltage controlled amplifiers 4 and 13 for providing the output signal So. As readily understood, the low pass filters 16 and 17 and the high pass filters 18 and 19 are used to split the frequency range into two frequency regions. In determining the frequency regions for these filters, a crossover frequency fc where the frequency regions are overlapped is selected such that a noise breathing phenomenon is effectively minimized in consideration of the foregoing discussion. The voltage controlled amplifiers 3 and 4 and 12 and 13 and the level sensors 5 and 6 and 14 and 15 are structured in a manner similar to the voltage controlled amplifiers 3 and 4 and the level sensors 5 and 6 discussed with reference to FIGS. 1 and 2, except that the voltage controlled amplifiers 3 and 4 and the level sensors 5 and 6 are adapted for compansion in the lower frequency region while the voltage controlled amplifiers 12 and 13 and the level sensors 14 and 15 are adapted for compansion in the higher frequency region. Since the frequency range is split into two frequency regions for the purpose of compression and expansion, the adder 20 is provided to combine the separate signals separately compressed in the split frequency regions and similarly the adder 21 is provided to combine the separate signals separately expanded in the split frequency regions.

In spite of the purpose for separately achieving compansion in the split frequency regions for reducing a noise breathing phenomenon by such a frequency region split type noise reducing apparatus as shown in FIG. 3, another problem arises in that an input signal frequency spectrum is not reproduced with fidelity as a result of compansion. This problem is caused by a frequency characteristic of the low pass filters 16 and 17 and the high pass filters 18 and 19. FIG. 4 shows the frequency characteristics of the low pass filters and the high pass filters, wherein the abscissa indicates the frequency and the ordinate indicates the attenuation, the curve identified as LPF showing the frequency characteristic of the low pass filters and the curve identified as HPF showing the frequency characteristic of the high pass filter. As seen in FIG. 4, a combination of the low pass filters and the high pass filters usually include a crossover region and the crossover region cannot be avoided, however sharp the cut off characteristic of the filters presently available are utilized. Therefore, a signal in the crossover region subjected to a level variation by the voltage controlled amplfier 3 in the lower frequency region on the occasion of compression is also subjected to a level variation by means of the voltage controlled amplifier 13 in the higher frequency region on the occasion of expansion. Conversely, the signal in the crossover region subjected to a level variation by the voltage controlled amplifier 12 in the higher frequency region on the occasion of compression is also subjected to a level variation by the voltage controlled amplifier 4 in the lower frequency region on the occasion of expansion.

Now, let it be assumed that the input signal is Si, the output signal So, the signal being recorded by the tape recorder is Sr, and the frequency characteristics of the low pass filter and the high pass filter are $YL(\omega)$ and $YH(\omega)$, respectively. Then $|YL(\omega)+YH(\omega)|=1$. Further let it be assumed that the gains of the voltage controlled amplifiers 3 and 12 for compression are $GL^c$ and $GH^c$, respectively, and the gains of the voltage controlled amplifiers 4 and 13 for expansion are $GL^e$ and $GH^e$, respectively. Then, in order to achieve complementary compression and expansion in recording and reproduction, naturally the following equation must be satisfied.

$$GL^c = 1/GL^e \cdot GH^c = 1/GH^e \quad (1)$$

However, in the FIG. 3 noise reducing apparatus, the signals being detected by the level sensors 5 and 14 for compression becomes as follows.

$$GL^c \cdot YL(\omega) \cdot Si \quad (2)$$

$$GH^c \cdot YH(\omega) \cdot Si \quad (3)$$

On the other hand, the signal being recorded Sr is expressed as follows.

$$Sr = \{GL^c \cdot YL(\omega) + GH^c \cdot YH(\omega)\} \cdot Si \quad (4)$$

Therefore, the signal signals being detected by the level sensors 6 and 15 for expansion are expressed by the following equations.

$$YL(\omega) \cdot Sr = \{GL^c \cdot YL(\omega) + GH^c \cdot YH(\omega)\} \cdot YL(\omega) \cdot Si \quad (5)$$

$$YH(\omega) \cdot Sr = \{GL^c \cdot YL(\omega) + GH^c \cdot YH(\omega)\} \cdot YH(\omega) \cdot Si \quad (6)$$

Since the signals being detected by the level sensors 5 and 14 for compression and the signals being detected by the level sensors 6 and 15 for expansion are different, it follows that the gains of the voltage controlled amplifiers 3 and 12 and the gains of the voltage controlled amplifiers 4 and 13 are not complementary to each other. The output signal So obtainable at the output terminal 2 is expressed by the following equation.

$$So = \{GL^c \cdot GL^e \cdot YL^2(\omega) + GH^c \cdot GH^e \cdot YH^2(\omega) + (GH^c \cdot GL^e + GL^c \cdot GH^e) \cdot YL(\omega) \cdot YH(\omega)\} \cdot Si \quad (7)$$

Referring to the equation (7), the term indicated in the bracket in equation (7), representing the overall transfer characteristic of the FIG. 3 apparatus becomes unity only of and when $GL^c = GL^e = GH^c = GH^e = 1$. In actuality, however, the gains of the voltage controlled amplifiers are variable as a function of the voltage control signal and therefore the condition of $GL^c = GL^e = GH^c = GH^e = 1$ is never met by the FIG. 3 apparatus. In other words, as a matter of fact, the term indicated in the bracket in equation (7) never becomes unity and accordingly $Si \neq So$. Thus, by virtue of a crossover of the signal among the lower and higher frequency regions, the output signal So becomes different from the intput signal Si. The extent of the difference between the input and the output signals Si and So is variable as a function of a level variation in the lower and higher frequency regions. As a result, according to the FIG. 3 apparatus, the fidelity of the signal after expansion is considerably deteriorated.

FIG. 5 is a graph showing qualitatively the manner of deterioration of the fidelity as discussed in the foregoing based on equation (7), wherein the abscissa indicates the frequency and the ordinate indicates the response. A gentle rise in the vicinity of the crossover frequency fc shows the above described deterioration of the fidelity. As described previously, the extent of the rise varies as a function of a variation of the gain of each voltage controlled amplifier by virtue of a variation of an energy distribution of the signal frequency spectrum.

As understood from the foregoing description, although a frequency region split in a noise reducing apparatus employing compansion for separate compansion in split frequency regions is very effective for reduction of a noise breathing phenomenon, another problem arises that the fidelity is considerably degraded, however sharp frequency characteristic filters presently available are employed.

SUMMARY OF THE INVENTION

Briefly described, the present invention is directed to an improvement in a frequency region split type noise reducing apparatus employing compression and expansion of a signal, comprising a compressor and an expander. According to the present invention, one of the compressor and the expander comprises first signal processing circuit means, including signal controlled variable gain means for the signal which is variable of a gain thereof as a function of a control signal, and level detecting means responsive to the signal for providing a control signal to the signal controlled variable gain means associated with the level of the signal, and the other of the compressor and the expander comprises feedback amplifying means including amplifying means and feedback circuit means coupled to the amplifying means, the feedback circuit means including a second signal processing circuit means including signal controlled variable gain means for the signal which is variable of a gain thereof as a function of a control signal, and level detecting means responsive to the signal for providing a control signal to the signal controlled variable gain means associated with the level of the signal. According to the present invention, the first signal processing circuit means and the second signal processing circuit means are structured to have substantially the same compression or expansion characteristic for linearly compressing or expanding in terms of a logarithmic scale the dynamic range of the signal. As a result, the compressor and the expander show substantially complementary compression and expansion characteristics.

The first signal processing circuit means and the second signal processing circuit means may be separate circuit means discretely implemented. However, in view of the fact that the compressor and the expander are not used simultaneously, the first signal processing circuit means and the second signal processing circuit means may be a common circuit means. Thus, in a preferred embodiment, the first signal processing circuit means and the second signal processing circuit means are implemented by employing a common circuit means and providing switching means for selectively connecting the common circuit means as the first signal processing circuit means or the second signal processing circuit means, as described previously. According to the last mentioned embodiment, the first signal processing circuit means and the second signal processing circuit means can be made of exactly the same compression or expansion characteristic and as a result the compressor and the expander show ideal complementary compression and expansion characteristics.

According to another aspect of the present invention, an improved companding apparatus for a noise reducing apparatus in a signal transmission path is provided. More specifically, the inventive companding apparatus comprises signal processing circuit means including signal controlled variable gain means for a signal which is variable of a gain thereof as a function of a control signal, and level detecting means responsive to the signal for providing a control signal to the signal controlled variable gain means associated with the level of the signal, an amplifying means, first switch circuit means for connecting the signal processing circuit means to the signal transmission path, whereby one of a compressor and an expander is formed, and second switch circuit means for connecting the amplifying means to the signal transmission path and for connecting the signal processing circuit means to the amplifying means as negative feedback circuit means for forming negative feedback amplifying means, whereby the other of a compressor and an expander is formed. The signal controlled variable gain means and the level detecting means are adjusted such that one of a compressor and an expander is formed through connection by the first switch circuit means and the other of a compressor and an exapander is formed through connection by the second switch circuit means. Thus, according to the present invention, a common signal processing circuit means can be selectively connected with ease to the signal transmission path or to the amplifying means to form negative feedback circuit means in the signal transmission path.

Accordingly, a principal object of the present invention is to provide an improved noise reducing apparatus of a split frequency region type and employing compression and expansion.

Another object of the present invention is to eliminate any adverse affect in a frequency characteristic, particularly in a crossover region in the frequency characteristic, in a noise reducing apparatus of a split frequency region type and employing compression and expansion.

A further object of the present invention is to achieve ideal complementary compression and expansion characteristics in a noise reducing apparatus of a split frequency region type and employing compression and expansion.

Still a further object of the present invention is to eliminate any adverse affect in a frequency characteristic, particularly in a crossover frequency region, in the frequency characteristic, and to achieve ideal complementary compression and expansion characteristics in a noise reducing apparatus of a split frequency region type and employing compression and expansion, by selectively employing common signal processing circuit means in a compressor or an expander.

These objects and other objects, features, aspects and advantages of the present invention will become more apparent from the following detailed description of the present invention when taken in conjunction with the accompanying drawings.

DESCRIPTION OF THE PREFERRED EMBODIMENTS

In general, ideal complementary and expansion characteristics can be attained by a transfer characteristic in a transmission path on the occasion of compression and a transfer characteristic in a signal transmission path on the occasion of expansion which are reversed to each other. According to the present invention, a negative feedback amplifier is employed to achieve transfer characteristics in compression and expansion which are reversed to each other.

Figure 3:
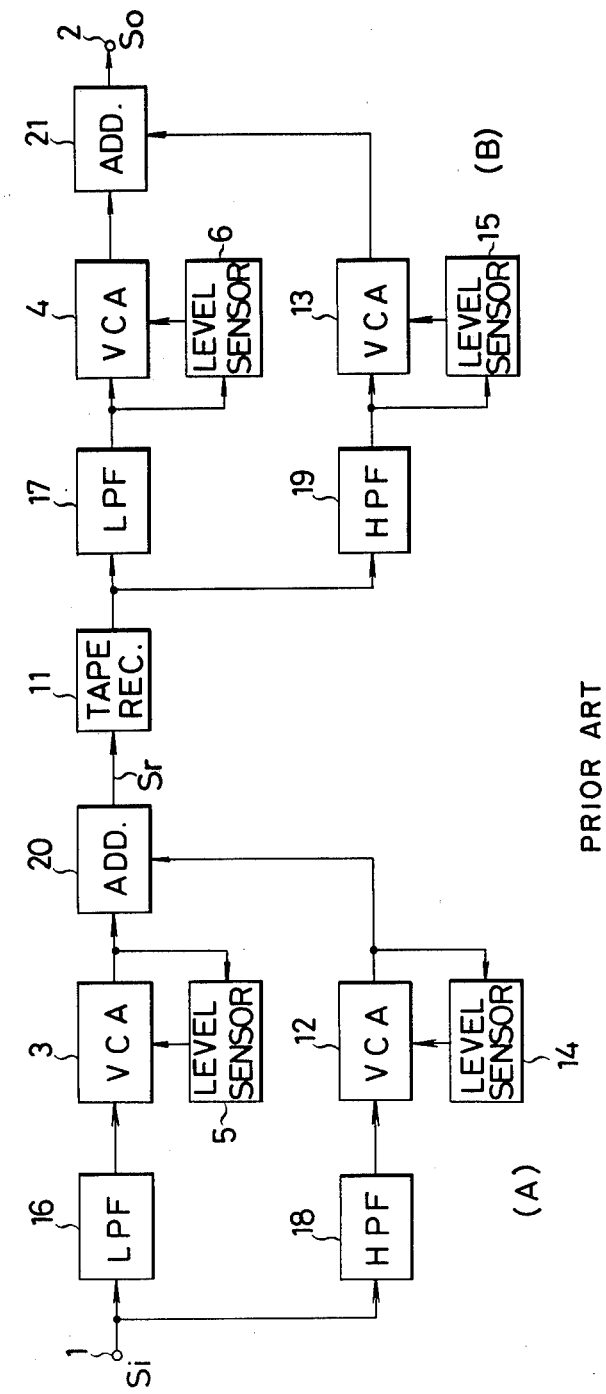
FIG. 3 is a block diagram of a split frequency region type noise reducing apparatus employing a compansion, wherein a frequency range is split into two frequency regions.
Figure 6A:
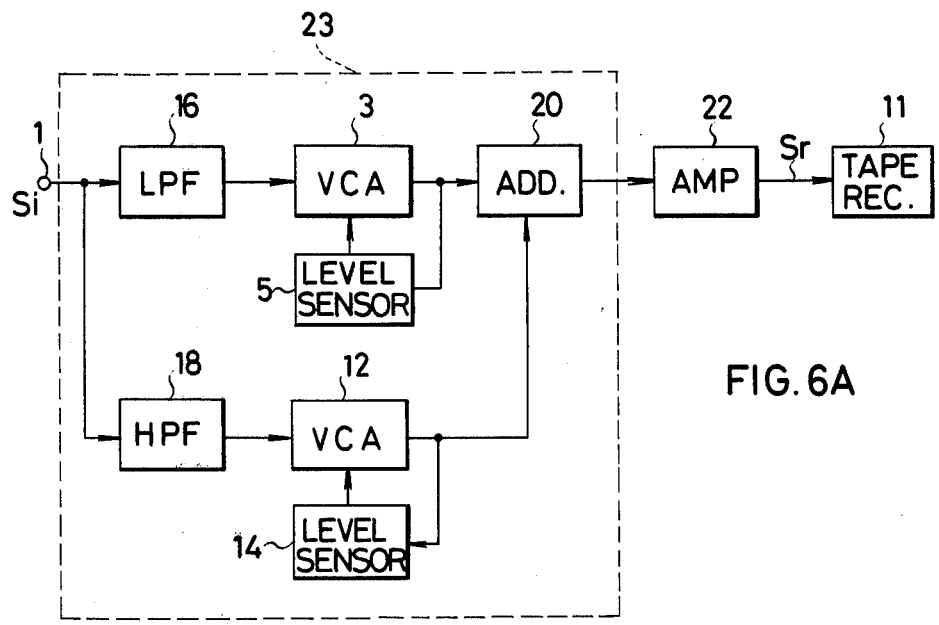
FIG. 6A is a block diagram of an embodiment of a compressor in accordance with the present invention.
Figure 6B:
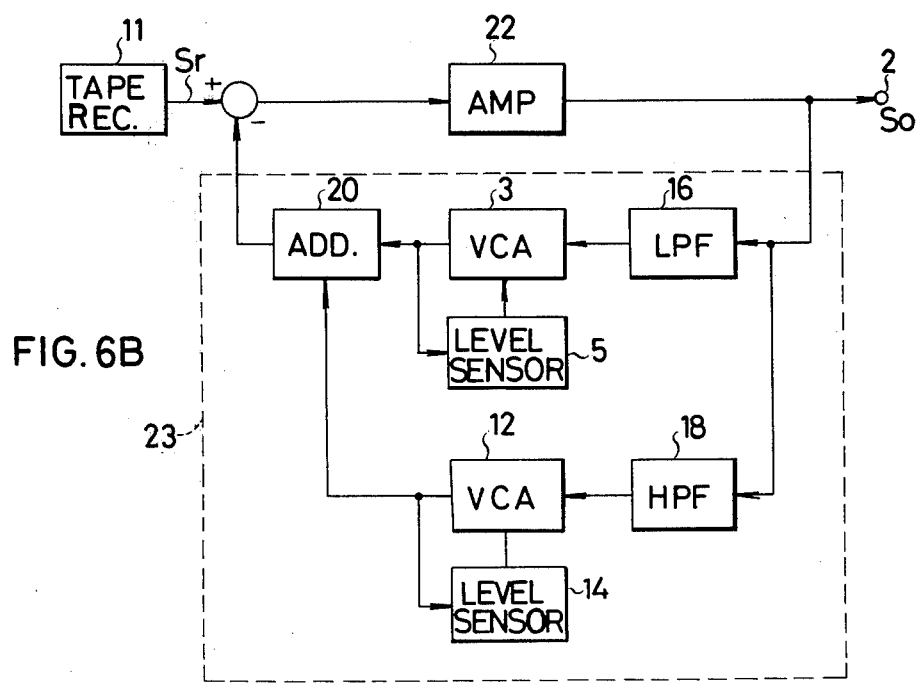
FIG. 6B is a block diagram of an embodiment of an expander in accordance with the present invention.

FIG. 6A shows a block diagram of an embodiment of a compressor in accordance with the present invention and FIG. 6B shows a block diagram of an embodiment of an expander in accordance with the present invention. In comparison with the FIG. 6A embodiment with the compressor portion in the FIG. 3 diagram, a signal processing circuit including the compressor 23 of the FIG. 6A embodiment is exactly the same as that of the compressor portion A in the FIG. 3 diagram. In the FIG. 6A embodiment, however, an amplifier 22 is interposed between the compressor 23 and the tape recorder 11. The circuit configuration and operation of the compressor 23 were fully described previously with reference to FIG. 3. Briefly described, the input signal Si is adapted to undergo compression of the dynamic ranges in the respective frequency regions and further undergo addition of separately compressed signal components to provide the resultant signal Sr, as shown in the equation (4). The resultant signal is amplified by the amplifier 22 and is then recorded in the tape recorder 11. With particular reference to FIG. 6B, the expander shown in FIG. 6B comprises a negative feedback amplifier including the amplifier 22 and the compressor 23 coupled in parallel with the amplifier 22 as a negative feedback circuit so as to form a negative feedback amplifier. Referring back to equation (4), the transfer characteristic of the compressor is shown by the term in the brackets in equation (4). Letting the term in the brackets in equation (4) be $T(\omega)$, then the transfer characteristic of the compressor is expressed by the following equation.

$$T(\omega) = GL^c \cdot YL(\omega) + GH^c \cdot YH(\omega) \tag{8}$$

Now assuming the gain of the amplifier 22 to be Ao, then from a general theory of a negative feedback amplifier, the relation between the input signal Sr and the output signal So on the occasion of expansion may be expressed by the following equation.

$$So = \frac{Ao}{1 + Ao \cdot T(\omega)} \cdot Sr \tag{9}$$

It should be pointed out that in designing the negative feedback amplifier shown in FIG. 6B the loop gain should be smaller than unity in the frequency region where the overall phase shift in the feedback loop exceeds 180° in order to avoid oscillation by virtue of the positive feedback, as well known to those skilled in the art.

Now assuming that the gain of the amplifier 22 is selected to be sufficiently large, then $Ao \cdot T(\omega) \gg 1$. Therefore, the equation (9) may be expressed as follows.

$$So = \frac{1}{T(\omega)} Sr \tag{10}$$

This means that according to the embodiment in FIGS. 6A and 6B, the transfer characteristic $1/T(\omega)$ is achieved in the expander, which is reversed to the transfer characteristic of the compressor. As a result, whatever the frequency characteristic in the compressor may be, a reverse transfer characteristic can be achieved in the expander. Thus, according to the present invention, the compression and expansion characteristics are ideally complementary to each other.

Although in the embodiment shown in FIGS. 6A and 6B, the same compressor 23 was commonly used in the FIG. 6A compressor and FIG. 6B expander by changing the connection thereof to the signal transmission path, the FIG. 6A compressor and the FIG. 6B expander may be separately formed by using separate circuits 23 having substantially the same electrical characteristic for the FIG. 6A compressor and the FIG. 6B expander. However, in view of the fact that the compressor and the expander are not used simultaneously but rather are used sequentially, it is most preferred to use the same compressor 23 by selectively connecting as the FIG. 6A compressor or as the FIG. 6B expander. In such a case, the compressor 23 of exactly the same electrical characteristic can be used in the compressor and the expander. This ensures that the compression and expansion characteristics are ideally complementary in the overall characteristic of the companding apparatus. Another advantage in such case is that since the circuit 23 is commonly used in the compressor and the expander, the inventive companding apparatus can be provided with a less expensive cost.

Figure 7A:
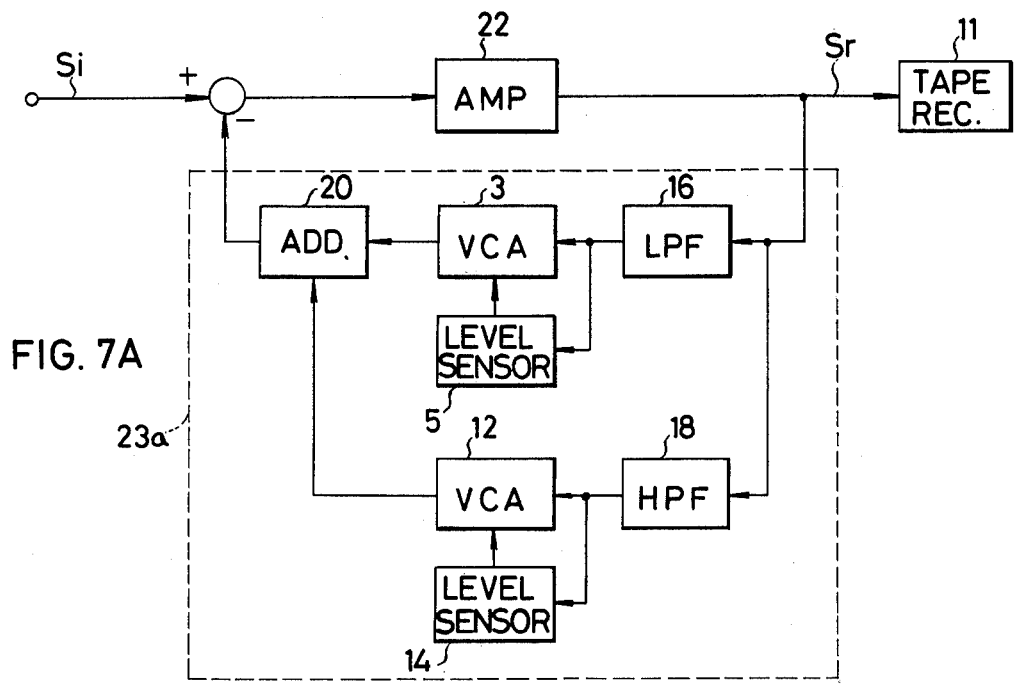
FIG. 7A is a block diagram of another embodiment of a compressor in accordance with the present invention.
Figure 7B:
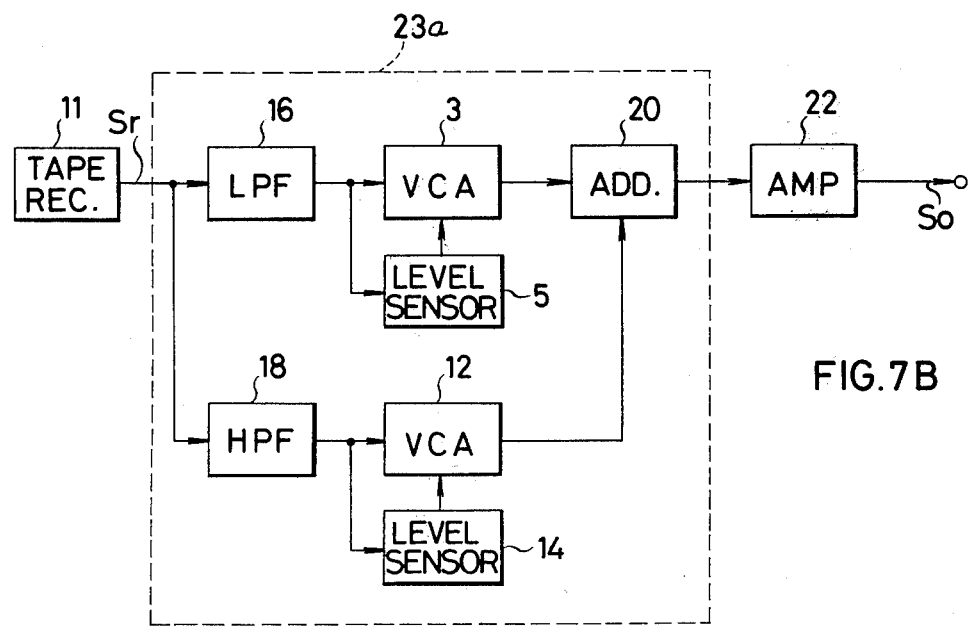
FIG. 7B is a block diagram of another embodiment of an expander in accordance with the present invention.

FIGS. 7A and 7B show block diagrams of another embodiment of a compressor and an expander in accordance with the present invention. According to the embodiment shown in FIGS. 7A and 7B, a signal processing circuit 23a is used as an expander in the FIG. 7B expander and the same signal processing circuit 23a is used as a feedback circuit in the FIG. 7A compressor so as to be coupled to the amplifier 22, thereby to form a feedback amplifier. Thus, it is pointed out that the signal processing circuit 23a in the embodiment of FIGS. 7A and 7B is structured in substantially the same manner as that of the compressor 23 in the embodiment of FIGS. 6A and 6B but is adjusted to operate as an expander when connected in the signal transmission line as shown in FIG. 7B and the same expander 23a of the FIG. 7A is used in the FIG. 7A compressor as a negative feedback circuit for the amplifier 22 so as to form a negative feedback amplifier. Thus, it is appreciated that between the embodiment of FIGS. 6A and 6B and the embodiment of FIGS. 7A and 7B the relation of the compressor and the expander is reversed but the above described complementary relation between the compression mode and the expansion mode remains the same. Thus, it is not believed necessary to describe in more detail the circuit configuration and the operation of the embodiment shown in FIGS. 7A and 7B, inasmuch as the circuit configuration and the operation of the embodiment shown in FIGS. 7A and 7B will be readily understood by those skilled in the art in consideration of the above described description as to the characteristic features thereof.

Figure 8:
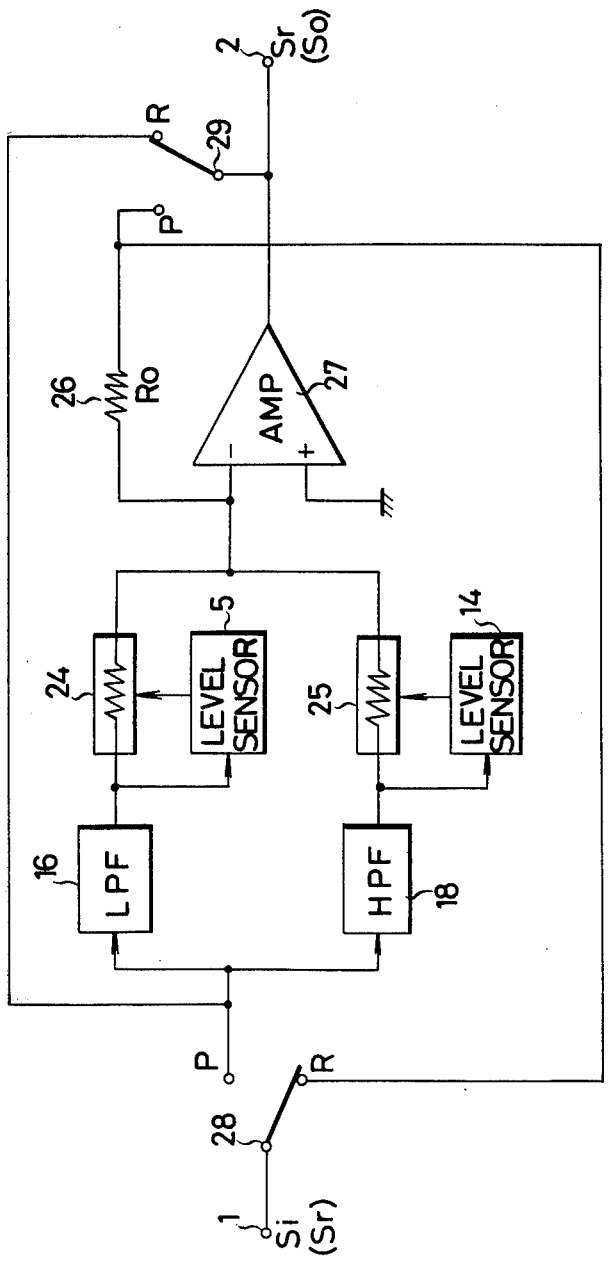
FIG. 8 is a block diagram of a preferred embodiment of the inventive companding apparatus, which is adapted to achieve the embodiment shown in FIGS. 7A and 7B.

FIG. 8 shows a block diagram of a preferred embodiment of the inventive companding apparatus, wherein a single amplifier can be switched between a compressor and an expander by switching circuit means of a simple structure. Referring to FIG. 8, the embodiment shown comprises switches 28 and 29 for selectively connecting the circuit concerned between the compression mode and the expansion mode, wherein connection to contacts R achieves a compressor or a compression mode and connection to contacts P achieves an expander or an expansion mode. The contact P of the switch 28 is connected to the low pass filter 16 and high pass filter 18 for splitting the frequency range of a signal. It is pointed out that the crossover frequency fc is selected to be most suited for reducing a noise breathing phenomenon. As a result of experimentation by the inventors, taking into consideration the spectrum of a piano music, it has been found that it is preferred to select the crossover frequency fc in the vicinity of 4.8 KHz. The low pass filter 16 and the high pass filter 18 are succeeded by voltage controlled variable gain means 24 and 25, respectively, which are operatively coupled to level sensors 5 and 14, respectively, which are responsive to the respective signal components for providing control signals to the voltage controlled variable gain means 24 and 25, respectively, which are associated with the respective signal levels. As the level sensors 5 and 14, any type of level sensors such as a root square mean detection type, a peak value detection type, an average value detection type or the like may be used, which is well known to those skilled in the art. The voltage controlled variable gain means 24 and 25 are structured to expand in a linear manner in terms of a logarithmic scale the dynamic range of the signal as a function of a voltage control signal supplied from the level sensors 5 and 14, respectively. The voltage controlled variable gain means may be implemented by a field effect device, a photoconductive device, a multiplier or the like. The outputs of the voltage controlled variable gain means 24 and 25 are connected together to a minus input of an operational amplifier 27. The plus input of the amplifier 27 is grounded. A fixed resistor 26 is connected between the minus input of the amplifier 27 and the contact P of the switch 29. The resistance value of the resistor 26 as well as the resistance values of the voltage controlled variable gain means 24 and 25 serves to determine the gain of the operational amplifier 27, as to be fully described subsequently. The contact R of the switch 28 and the contact P of the switch 29 are connected. The contact P of the switch 28 and the contact R of the switch 29 are connected. The output of the operational amplifier 27 is connected to the switch 29 and to the output terminal 2.

In operation, for the purpose of compression mode, the switches 28 and 29 are turned to the contacts R and for the purpose of expansion mode the switches 28 and 29 are turned to the contacts P. It is readily understood that in the compression mode substantially the same circuit configuration as the FIG. 7A is achieved by the FIG. 8 embodiment and in the expansion mode substantially the same circuit configuration as the FIG. 7B is achieved by the FIG. 8 embodiment. Thus, the operational amplifier 27 serves as a voltage controlled amplifier for determining the gain thereof in the expansion mode and serves as a negative feedback amplifier in the compression mode which is reverse to that in the expansion mode. It is pointed out that the phase characteristic of the frequency region splitting filters 16 and 18 should be designed in consideration of the phase characteristic of the operational amplifier 27 and of the voltage controlled variable gain means 24 and 25 in order to avoid oscillation by virtue of a position feedback. Since the phase shift of the operational amplifier 27 could exceed 90° in the higher frequency region, a frequency region splitting filter having an attenuation characteristic of 6 dB/Oct. was used in the embodiment, thereby to achieve compensation such that the attenuation characteristic is increased in the high frequency region.

Now assuming in FIG. 8 embodiment that voltage controlled variable resistance devices such as a photoconductive devices are employed as voltage controlled variable gain means 24 and 25, and assuming further the resistance values thereof to be RL and RH, respectively, and the resistance value of the fixed resistor 26 to be Ro, then the relation between the input signal Si and the output signal Sr in the expansion mode may be expressed by the following equation.

$$Sr = -\frac{1}{\frac{Ro}{RL \cdot YL} + \frac{Ro}{RH \cdot YH}} \cdot Si \quad (11)$$

The resistance values RL and RH are controlled in reverse proportion to the signal levels and the following equation is obtained.

$$\frac{Ro}{RL} = GL^e \quad \frac{Ro}{RH} = GH^e \quad (12)$$

Accordingly, the equation (11) may be expressed by the following equation.

$$Sr = -\frac{1}{\frac{GL^e}{YL} + \frac{GH^e}{YH}} \cdot Si \quad (13)$$

Now the relation between the input signal Sr and the output signal So in the compression mode may be expressed by the following equation.

$$So = -\left(\frac{Ro}{RL \cdot YL} + \frac{Ro}{RH \cdot YH}\right) Sr = \quad (14)$$

$$-\left(\frac{GL^e}{YL} + \frac{GH^e}{YH}\right) Sr$$

Thus, it is understood that exactly the reverse transfer characteristics are obtained in the compression and expansion mode according to the FIG. 8 embodiment. Thus, totally complementary compression and expansion characteristics can be achieved, while abnormality in the frequency characteristic in the vicinity of the crossover frequency is eliminated which inevitably occurred in the prior art noise reducing apparatus of a frequency region split type employing compression and expansion.

Figure 9:
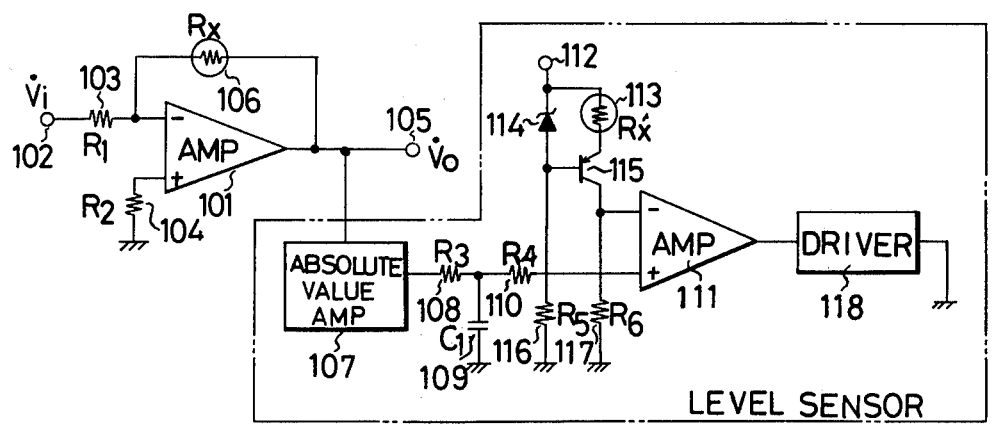
FIG. 9 is a block diagram showing in more detail a preferred embodiment of a signal processing circuit utilizable as a signal compressor.

FIG. 9 is a block diagram showing in more detail a preferred embodiment of a signal processing circuit utilizable as a signal compressor by adjusting properly the compansion coefficient. Referring to FIG. 9, an operational amplifier 101 corresponding to the amplifier 27 in the FIG. 8 embodiment is connected to receive an input signal Vi from an input terminal 102 at a minus input terminal through a resistor 103, a positive input terminal being grounded through a resistor 104. The output terminal 105 of the operational amplifier 101 is connected through an externally controlled variable impedance device 106 corresponding to the variable gain devices 24 and 25 in the FIG. 8 embodiment to the minus input terminal of the operational amplifier 101, whereby the output of the operational amplifier 101 is fed back into the input thereof. The output signal from the output terminal 105 is applied to the level sensor corresponding to the level sensors 5 and 14 in the FIG. 8 embodiment. More specifically, the output signal of the amplifier 101 is applied through an absolute value amplifier 107 to an integrating circuit comprising a resistor 108 and a capacitor 109, whereby the output signal is smoothed by the integrating circuit. The absolute value amplifier 107 and the integrating circuit constitute a circuit for detecting a mean value or an envelope value of an absolute value of the amplitude of the output signal. The signal thus obtained representing the level of the output obtainable at the terminal 105 is applied through a resistor 110 to a plus input terminal of an operational amplifier 111. A minus input terminal of the operational amplifier 111 is connected to the collector electrode of a PNP type transistor 115 and is also grounded through a resistor 117. The emitter electrode of the transistor 115 is connected through an externally controlled variable impedance device 113 to a voltage supply 112. The base electrode of the transistor 115 is connected through a constant voltage device 114 to the voltage supply 112 and is also grounded through a resistor 116. The output terminal of the operational amplifier 111 is connected to a driver 118 which is operatively coupled to the above described externally controlled variable impedance devices 106 and 113 such that the variable impedance devices 106 and 113 are simultaneously driven by the driver 118. If the variable impedance devices 106 and 113 are photoresistive devices, then the driver 118 would operate one or more lamps to control these photoresistive devices. In the embodiment shown, the above described operative coupling is adjusted such that an increase of a voltage applied to the driver decreases the impedance values of the above described variable impedance devices 106 and 113. It is pointed out that only one variable gain device and one level sensor are shown for simplicity of illustration.

For the purpose of describing the operation of the FIG. 9 embodiment, first let it be assumed that the values of the resistors 103, 104, 108, 110, 116, 117 and the capacitor 109 are $R_1$, $R_2$, $R_3$, $R_4$, $R_5$, $R_6$, and $C_1$, respectively, and the resistance values of the variable impedance devices 106 and 113 and $R_x$ and $R_{x'}$, respectively. Then, the relation between the output voltage $\dot{V}_o$ at the output terminal 105 with the input voltage $\dot{V}_i$ is expressed by the following equation.

$$\dot{V}_o = -\frac{R_x}{R_1} \cdot \dot{V}_i \tag{15}$$

Alternatively, assuming that the amplitude components of the voltages $\dot{V}_o$ and $\dot{V}_i$ and $V_o$ and $V_i$, respectively, and the time components is $e^{j\phi(t)}$, then the following equation is obtained.

$$V_o e^{j\phi(t)} = -\frac{R_x}{R_1} V_i e^{j\phi(t)} \tag{16}$$

After the signal is processed by the absolute value amplifier 107 and by the integrating circuit including the resistor 108 and the capacitor 109, the output of the integrating circuit is proportional to the amplitude component of $\dot{V}_o$ and expressed as $CV_o$. The signal $CV_o$ to the plus input terminal of the operational amplifier 111. On the other hand, assuming that the voltage across the above described constant voltage device 114 is Vz and the voltage drop between the base and emitter electrodes of the transistor 115 is Vbe, then the input signal to be applied to the minus input terminal of the operational amplifier 111 is $$\frac{R_6(Vz - Vbe)}{R_{x'}}.$$

Thus, the driver 118 for the variable impedance device 113 operates such that an increase of a drive voltage reduces an impedance value of the variable impedance device 113. The decrease of the impedance value of the variable impedance device 113 causes an increase of the voltage applied to the minus input terminal and thus a decrease of the output voltage of the operational amplifier 111. Thus, the overall system constitutes a negative feedback loop for maintaining the voltages at the plus and minus input terminals equal. Therefore, the following equation is obtained.

$$CV_o = \frac{R_6(Vz - Vbe)}{R_{x'}} \tag{17}$$

Now the impedance value of the variable impedance device 113 is primarily determined by the voltage V of the driver 118 and is expressed by the following equation.

$$R_{x'} = K_1 f(V) \tag{18}$$

Since the variable impedance devices 106 and 113 are controlled by the same driver, the following equation is obtained.

$$R_x = K_2 f(V) \tag{19}$$

where $K_1$ and $K_2$ are constants determinable by a positional relation of these variable impedance devices with the driver. Accordingly, $$R_{x'} = \frac{K_1}{K_2} \cdot R_x \qquad (20)$$

By substituting the equation (20) for equation (17), and eliminating $R_x$ by the equation (15), $$C\dot{V}_o V_o = \frac{K_2(Vz - Vbe)R_6}{K_1 R_1} \cdot \dot{V}_i$$

Accordingly, as for the amplitude component, the following equation is obtained.

$$V_o = \sqrt{\frac{K_2 R_6 (Vz - Vbe)}{CK_1 R_1}} \sqrt{V_i} \qquad (21)$$

Thus, it is appreciated that the signal input is compressed by a half in terms of dB representation.

Figure 10:
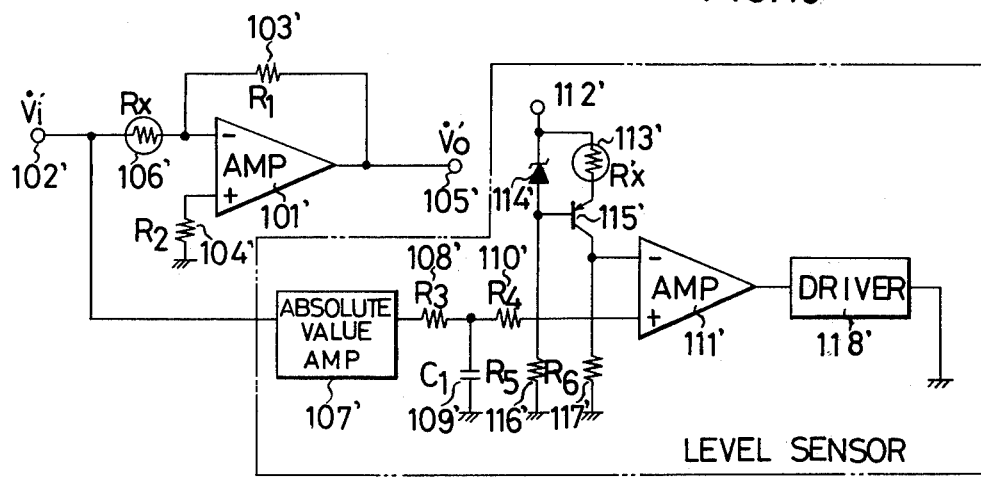
FIG. 10 is similar to FIG. 9 but shows a block diagram showing in more detail an example of a signal expander.

FIG. 10 is similar to FIG. 9 but shows a block diagram showing in more detail an example of a signal expander which can be advantageously employed in the present invention. All the reference characters are followed by a prime notation in FIG. 10. In comparison of the FIG. 10 embodiment with the FIG. 9 embodiment, the arrangement of the resistor 103' and the variable impedance device 106' is reversed and the input to the level sensor absolute value amplifier 107' is connected from the input terminal 102'. Here again, if the variable impedances 106' and 113' are photoresistive devices, then the driver 118' would operate one or more lamps. Those components other than the above described resistor 103', the variable impedance device 106' and the level detector 107' are exactly the same as those described with reference to FIG. 9. Thus, it is not believed necessary to describe in more detail the circuit configuration of the FIG. 10 embodiment. Similarly to the equation (17), the following equation is obtained.

$$C\dot{V}_i = \frac{R_6(Vz - Vbe)}{R_{x'}} \qquad (22)$$

and $$\dot{V}_o = \frac{R_1}{R_x} \cdot \dot{V}_{i'} \qquad (23)$$

By eliminating $R_x$ and $R_{x'}$ from the equations (22), (23) and (20), the following equation is obtained.

$$\dot{V}_{o'} = \frac{CK_1 R_1}{K_2 R_6 (Vz - Vbe)} \dot{V}_i \dot{V}_{i'} \qquad (24)$$

As for the amplitude component, the following equation is obtained.

$$V_{o'} = \frac{CK_1 R_1}{K_2 R_6 (Vz - Vbe)} V^2_{i'} \qquad (25)$$

Thus, it will be appreciated that the signal is expanded by the FIG. 10 embodiment. According to the embodiments of the FIGS. 9 and 10 a compressor and an expander are provided which are of an excellent linearity, of a compensated temperature characteristic and of a stabilized operation.

Figure 11A:
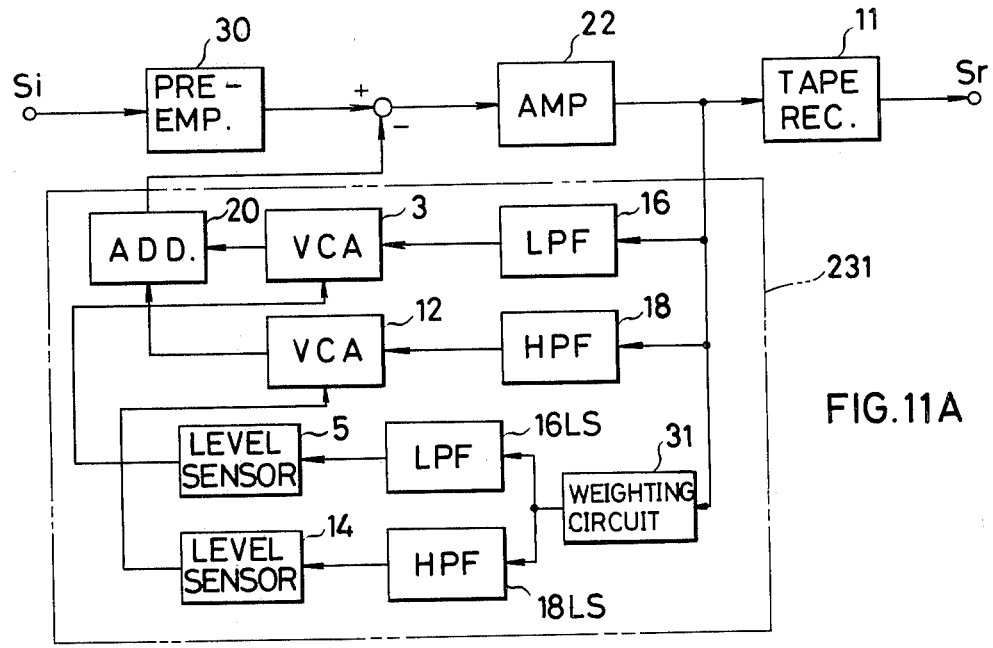
FIG. 11A shows a block diagram of a further embodiment of a compressor in accordance with the present invention.
Figure 11B:
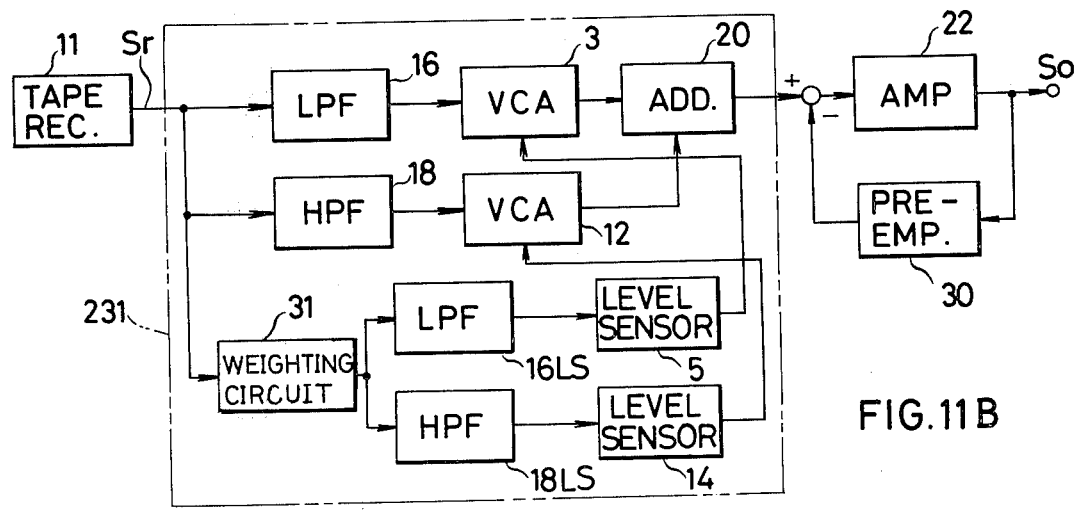
FIG. 11B shows a block diagram of a further embodiment of an expander in accordance with the present invention.

FIGS. 11A and 11B are similar to FIGS. 7A and 7B but shows block diagram of a further embodiment of a compressor and an expander in accordance with the present invention. In comparing the embodiment shown in FIGS. 11A and 11B with the embodiment shown in FIGS. 7A and 7B, a preemphasis circuit 30 is employed at the input of the compressor shown in FIG. 11A and the preemphasis circuit 30 is connected in parallel with the amplifier 22 in the expansion mode shown in FIGS. 11B. A signal processing circuit 231 corresponding to the signal processing circuit 23 in FIGS. 7A and 7B is shown employing a frequency weighting circuit 31 coupled to the signal transmission path, the output of which frequency weighting circuit is coupled to another low pass filter 16LS and another high pass filter 18LS, both the low pass filter 16LS and the high pass filter 18LS being connected to the level sensors 5 and 14, respectively. Since the other circuit configuration of the embodiment shown in FIGS. 11A and 11B is the same as that of the embodiment shown in FIGS. 7A and 7B, it is not believed necessary to describe the same in more detail.

Figure 1:
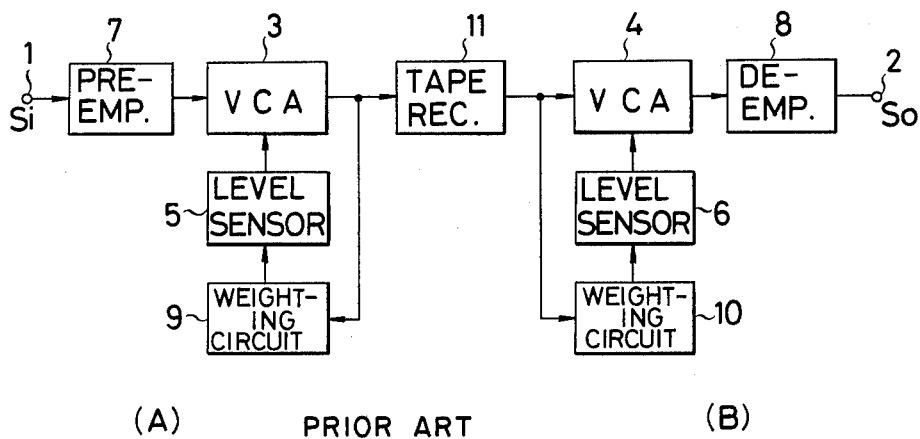
FIG. 1 is a block diagram of a prior art type compression/expansion type noise reducing apparatus applied to a tape recorder.
Figure 2:
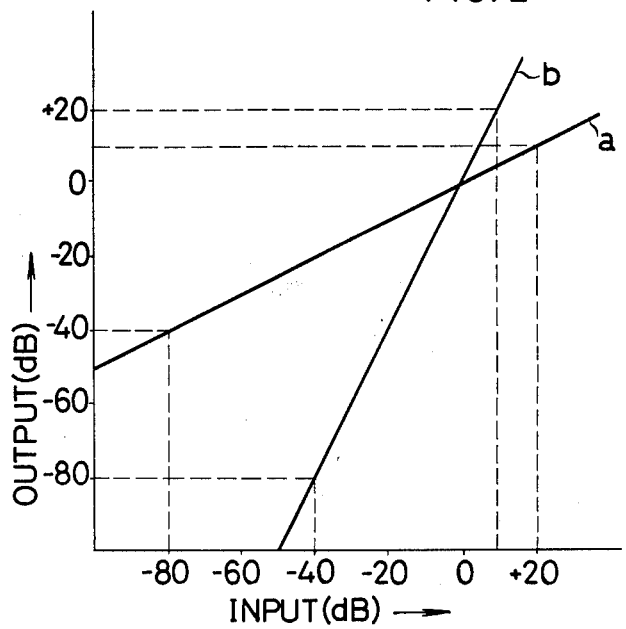
FIG. 2 is a graph showing a compansion characteristic in the case where the compansion coefficient is 2, wherein the abscissa indicates the input level and the ordinate indicates the output level, the line a showing a compression characteristic and the line b showing an expansion characteristic.

Employment of the preemphasis circuit 30 in the compressor shown in FIG. 11A was discussed with reference to FIG. 1. On the other hand, the amplifier 22 connected in parallel with the preemphasis circuit 30 in the expansion mode shown in FIG. 11B constitutes a feedback amplifier, with the preemphasis circuit 30 serving as a negative feedback circuit and the negative feedback amplifier serves as a deemphasis circuit. Employment of the deemphasis circuit in the expander was also discussed with reference to FIG. 1.

The basic principle of employment of the weighting circuit between the signal transmission path and the level sensor in both the compression and expansion modes was also discussed with reference to FIG. 1. However, the frequency weighting circuit 31 in the embodiment shown in FIGS. 11A and 11B is somewhat different from that discussed with reference to FIG. 1 and will be described in more detail in the following.

Figure 4:
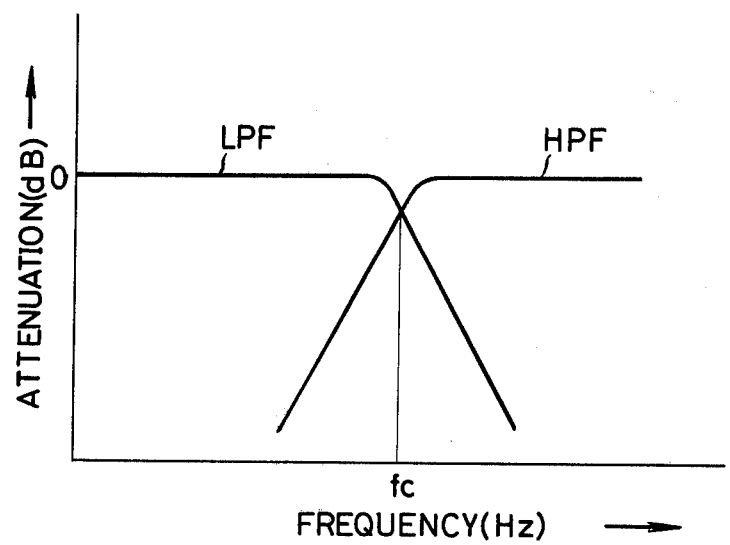
FIG. 4 shows a frequency characteristic of the low pass filters and the high pass filters, wherein the abscissa indicates the frequency and the ordinate indicates the attenuation, the curve identified as LPF showing the frequency characteristic of the low pass filter and the curve identified as HPF showing the frequency characteristic of the high pass filter.
Figure 5:
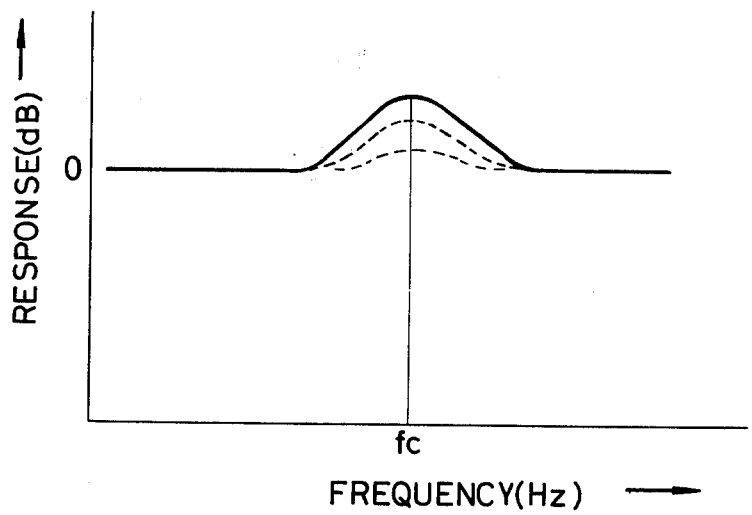
FIG. 5 is a graph showing qualitatively the manner of deterioration of the fidelity, wherein the abscissa indicates the frequency and the ordinate indicates the response.
Figure 12:
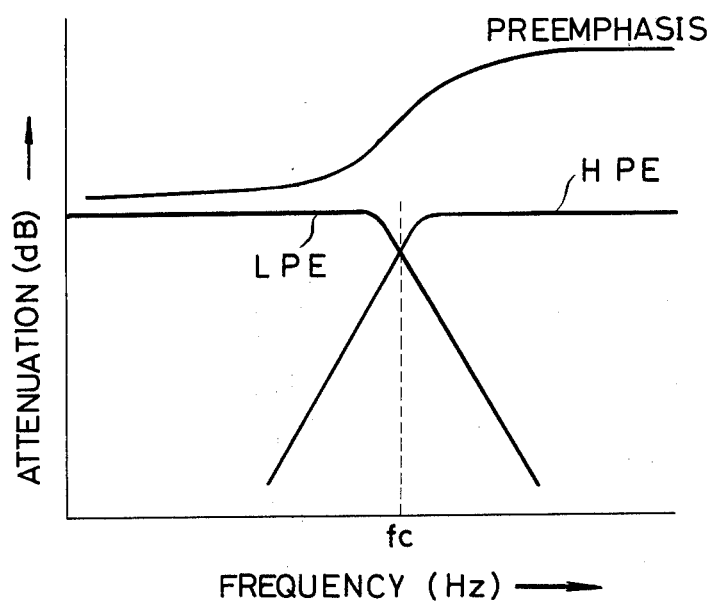
FIG. 12 shows a frequency characteristic of the low pass filter and the high pass filter and the preemphasis circuit, wherein the abscissa indicates the frequency and the ordinate indicates the attenuation, the curve identified as LPF showing the frequency characteristic of the low pass filter, the curve identified as HPF sowing the frequency characteristic of the high pass filter and the curve identified as PREEMPHASIS showing the frequency characteristic of the preemphasis circuit.

As discussed earlier herein, the frequency weighting circuit 31 is employed for the purpose of preventing saturation of a signal in a higher frequency region by virtue of emphasis in the higher frequency region by means of the preemphasis circuit 30. Referring to FIGS. 4 and 5 and further to FIG. 12, usually the frequency weighting circuit 31 is employed only for the higher frequency region level sensor 14 among the level sensors 5 and 14. However, since the crossover frequency fc for the frequency region split filters 16 and 18 is relatively high, as previously discussed with reference to FIG. 4, a frequency region as emphasized by means of the preemphasis is liable to cross in the lower frequency region of voltage controlled amplifier 3. In other words, an influence of the preemphasis is liable to be exerted upon the lower frequency region lower than the crossover frequency fc. In such a situation, however, saturation of the signal in the lower frequency region cannot be suppressed by the above described usual arrangement. Therefore, in order to eliminate the above described problem, it is necessary to impose the frequency weighting operation of the same characteristic upon the outputs of the low pass filter 16 and the high pass filter 18 for the lower and higher frequency region voltage controlled amplifiers 3 and 12. In case where there are only several, e.g. two or three, split frequency regions no serious problem results. However, in case where the number of the split frequency regions is greater, the differences of the frequency weighting characteristics of the respective frequency regions become a problem. In particular, drips in a single sine wave sweep response in the frequency region of 300 Hz to 1 KHz for the above described reason make the level setting difficult on the occasion of recording. In addition, when it is desired to change or adjust 0 dB level of the companding apparatus, i.e. the level of the signal which does not vary when the signal is processed by the companding apparatus, an adjusting operation for adjusting the full range of the frequencies to be flat is extremely tiresome with the above described usual arrangement wherein the voltage controlled amplifiers are adapted to be controlled with the outputs of the respective filters allotted therefor. Since the frequency weighting circuit, as actually implemented, usually has a voltage gain, the 0 db level of the circuit can be varied by varying the gain thereof. The above described inconveniences are eliminated by employment of the separate low pass filter 16LS and the high pass filter 18LS both connected to receive the output of the single frequency weighting circuit 31 to provide the signal component in the respective split frequency regions to the corresponding level sensors 5 and 14.

Referring again to FIGS. 11A and 11B, a consideration is preferably given in design of the low pass filter 16 and the high pass filter 18. More specifically, with particular reference to FIG. 11A, it would be appreciated that the low pass filter 16 and the high pass filter 18 constitute a negative feedback loop. Therefore, a phase rotation within the loop must be smaller than 180°. If a phase rotation in the loop exceeds 180°, then the loop gain of the loop must be smaller than unity. Usually, the phase rotation of the amplifier 22 exceeds 90° in the higher frequency region and if a filter having an attenuation characteristic of 6 dB/Oct. is employed, the phase rotation in the loop exceeds 180°, which could cause oscillation.

Figure 13:
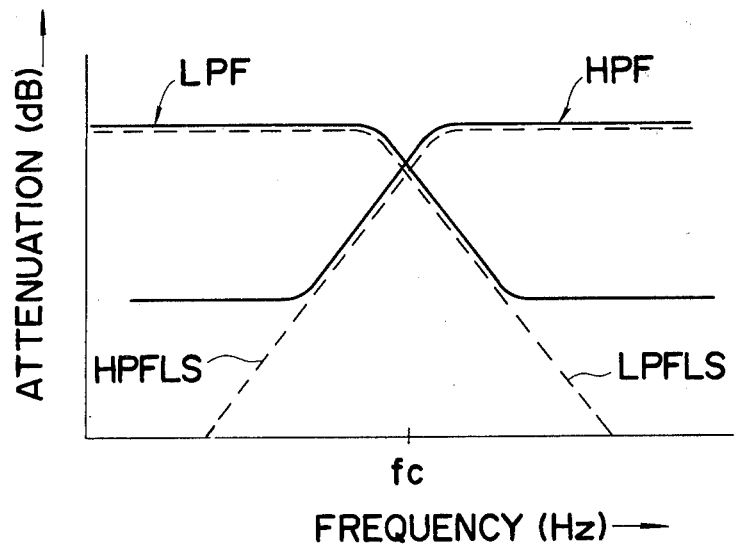
FIG. 13 shows a preferred frequency characteristic of the low pass filters and the high pass filters in the embodiment shown in FIGS. 11A and 11B, wherein the abscissa indicates the frequency and the ordinate indicates the attenuation.

FIG. 13 shows a preferred frequency characteristic of the low pass filters and the high pass filters being employed in the embodiment shown in FIGS. 11A and 11B, wherein the abscissa indicates the frequency and the ordinate indicates the attenuation, the curve identified as LPF showing the frequency characteristic of the low pass filter 16, the curve identified as HPF showing the frequency characteristic of the high pass filter 18, the curve identified as LPFLS showing the frequency characteristic of the low pass filter 16LS, and the curve identified as HPFLS showing the frequency characteristic of the high pass filter 18LS. As seen from the illustration in FIG. 13, the frequency characteristics of the filters 16 and 18 are selected such that the attenuation amount of the filters is saturated at a given value so as exhibit a step portion in the characteristic curve, whereby the phase rotation by these filters 16 and 18 is supressed to be smaller than 90°. On the other hand, the frequency characteristics of the filters 16LS and 18LS are preferably abrupt. The reason is that if and when the frequency characteristics of the filters 16LS and 18LS are the same as those of the filters 16 and 18 the lower frequency region level sensor 5 is liable to detect the higher frequency region signal to some extent and the higher frequency region level sensor 14 is liable to detect the lower frequency region signal to some extent, with the result that the effect of the frequency region splitting is diminished.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A split frequency region noise reducing apparatus employing compression and expansion of a signal comprising:
   compressor means and expander means,
   one of said compressor and expander means having first signal processing circuit means for receiving said signal and for producing a modified signal corresponding thereto, the other of said compressor and expander means having second signal processing circuit means for receiving said modified signal, each of said first and second signal processing circuit means having substantially the same compression or expansion characteristic for respectively compressing or expanding the dynamic range of the signal applied thereto and each comprising,
   first and second filter means for respectively selecting a high frequency region portion and a low frequency region portion of the signal applied to said signal processing means,
   a respective controlled variable gain amplifier coupled to the output of each of said first and second filter means receiving the frequency region portion of the signal selected thereby,
   third and fourth filter means also for respectively selecting a high frequency region portion and a low frequency region portion of the signal applied to said signal processing means,
   a respective level detecting means having an input coupled to the output of each of said third and fourth filter means for producing an output control signal in response to the selected high or low frequency region portion applied thereto, said level detecting means output signal being coupled to the controlled variable gain amplifier means which receives the corresponding higher or lower frequency region of the signal applied to the processing means, and
   adding means for adding the outputs of the controlled variable gain amplifier means.

2. A frequency region split type noise reducing apparatus in accordance with claim 1, wherein said first signal processing circuit means and said second signal processing circuit means comprise common signal processing circuit means, and which further comprises switching means for selectively connecting said common signal processing circuit means as said first signal processing circuit means or said second signal processing circuit means.

3. A frequency region split type noise reducing apparatus in accordance with claim 1 wherein said first signal processing circuit means and said second signal processing circuit means comprise separate signal processing circuit means fixedly connected as said first signal processing circuit means and said second signal processing circuit means.

4. A frequency region split type noise reducing apparatus in accordance with claim 1 wherein each said filter means is adapted to exhibit a saturated frequency characteristic.

5. A frequency region split type noise reducing apparatus in accordance with claim 1 wherein said one of the compressor and expander means is said compressor means, and said first signal processing circuit means and said second signal processing circuit means are structured to have substantially the same compression characteristic.

6. A frequency region split type noise reducing apparatus in accordance with claim 1 wherein said one of the compressor and expander means is said expander means, and said first signal processing circuit means and said second signal processing circuit means are structured to have substantially the same expansion characteristic.

7. A frequency region split type noise reducing apparatus in accordance with claim 1 wherein said compressor means further comprises preemphasis circuit means coupled to the input of said compressor means and said expander means further comprises deemphasis circuit means coupled to the output of said expander means.

8. A split frequency region noise reducing apparatus as in claim 1 further comprising weighting circuit means for receiving said signal applied to the signal processing means and applying it to the input of said third and fourth filter means.

9. A split frequency region noise reducing apparatus as in claim 1 wherein one of said first and second signal processing means includes feedback amplifier means responsive to the signal produced by said adding means.

10. A frequency region split type noise reducing apparatus, comprising compressor means for a signal and expander means for a signal; said compressor means comprising a first plurality of filters for splitting the frequency range of said signal into a plurality of frequency regions, a level sensor coupled to each filter of said first plurality of filters for detecting the level of the signal components in the respective frequency region split by the respectively coupled filter of said first plurality of filters for providing a control signal associated with the levels of the signal components in the respective frequency region, frequency weighting circuit means responsive to said signal for providing a frequency weighted signal to said first plurality of filters, a second plurality of filters for splitting the frequency range of said signal into a plurality of frequency regions, a plurality of voltage controlled variable gain amplifying means each for receiving from a respective filter of said second plurality of filters the frequency region of the signal split by the corresponding filter of said second plurality of filters and responsive to the respective control signal of the corresponding level sensor of the corresponding frequency region for linearly compressing in terms of a logarithmic scale the dynamic range of said signal, and adding means for adding the outputs as compressed by said plurality of voltage controlled variable gain amplifying means for providing a composite signal, amplifier means, switching means for applying said composite signal to said amplifier means, said switching means also for selectively connecting said signal compressor means to said amplifier means to form a negative feedback circuit in which the input of said compressor means is coupled to the output of said amplifier means and the output of said compressor means is coupled to the input of said amplifier means, whereby said signal expander means is implemented by said negative feedback circuit including said compressor means.

11. A frequency region split type noise reducing apparatus in accordance with claim 10, wherein each said frequency region splitting filter means is adapted to exhibit a saturated frequency characteristic.

12. A frequency region split type noise reducing apparatus in accordance with claim 10, wherein said signal compressor means further comprises preemphasis circuit means coupled to the input of said signal compressor means and said signal expander means further comprises deemphasis circuit means coupled to the output of said signal expander means.

13. A frequency region split type noise reducing apparatus, comprising compressor means for a signal and expander means for a signal; said expander means comprising a first plurality of filters for splitting the frequency range of said signal into a plurality of frequency regions, a level sensor coupled to each filter of said first plurality of filters for detecting the level of the signal components in the respective frequency region split by the respectively coupled filter of said first plurality of filters for providing a control signal associated with the levels of the signal components in the respective frequency region, frequency weighting circuit means responsive to said signal for providing a frequency weighted signal to said first plurality of filters, a second plurality of filters for splitting the frequency range of said signal into a plurality of frequency regions, a plurality of voltage controlled variable gain amplifying means each for receiving from a respective filter of said second plurality of filters the frequency region of the signal split by the corresponding filter of said second plurality of filters and responsive to the respective control signal of the corresponding level sensor of the corresponding frequency region for linearly expanding in terms of a logarithmic scale the dynamic range of said signal, and adding means for adding the outputs as expanded by said plurality of voltage controlled variable gain amplifying means for providing a composite signal, amplifier means, switching means for applying said composite signal to said amplifier means, said switching circuit means also for selectively connecting said signal expander means to said amplifier means to form a negative feedback circuit in which the input of said expander means is coupled to the output of said amplifier means and the output of said expander means is coupled to the input of said amplifier means, whereby said signal compressor means is implemented by said negative feedback circuit including said expander means.

14. A frequency region split type noise reducing apparatus in accordance with claim 13, wherein each said frequency region splitting filter means is adapted to exhibit a saturated frequency characteristic.

15. A frequency region split type noise reducing apparatus in accordance with claim 13, wherein said signal compressor means further comprises preemphasis circuit means coupled to the input of said signal compressor means and said signal expander means further comprises the deemphasis circuit means coupled to the output of said signal expander means.

* * * * *